US005123500A

United States Patent [19]

Malhoit et al.

[11] Patent Number: 5,123,500

[45] Date of Patent: Jun. 23, 1992

[54] LOUDSPEAKER ENCLOSURE

[76] Inventors: Thomas A. Malhoit, 4134 Garden Park; Virgil J. Wurster, 3014 Brock, both of Toledo, Ohio 43613

[21] Appl. No.: 665,098

[22] Filed: Mar. 6, 1991

[51] Int. Cl.[5] .......... H05K 5/00

[52] U.S. Cl. .......... 181/144; 181/152; 181/154; 181/199

[58] Field of Search .......... 181/148-156, 181/198, 199, 141, 144-147, 166

[56] References Cited

U.S. PATENT DOCUMENTS

| | | | |
|---|---|---|---|
| 4,122,910 | 10/1978 | Wehner | 181/144 |
| 4,142,604 | 3/1979 | Smith | 181/156 |
| 4,146,111 | 3/1979 | Mae et al. | 181/154 |
| 4,173,266 | 11/1979 | Pizer et al. | 181/156 |
| 4,176,730 | 12/1979 | Mushkin | 181/148 |
| 4,200,170 | 4/1980 | Williams, Jr. | 181/155 |
| 4,206,830 | 6/1980 | Sohma et al. | 181/141 |
| 4,249,037 | 2/1981 | Dexter | 181/144 X |
| 4,280,586 | 7/1981 | Petersen | 181/150 |
| 4,348,552 | 9/1982 | Siccone | 181/147 X |
| 4,420,061 | 12/1983 | Levy | 181/166 |
| 4,439,644 | 3/1984 | Bruney, III | 181/151 X |
| 4,450,929 | 5/1984 | Marrs | 181/149 |
| 4,588,042 | 5/1986 | Palet et al. | 181/153 |
| 4,650,031 | 3/1987 | Yamamoto | 181/156 |
| 4,690,244 | 9/1987 | Dickie | 181/146 |
| 4,730,694 | 3/1988 | Albarino | 181/153 |
| 4,750,585 | 6/1988 | Collings | 181/148 |
| 4,753,317 | 6/1988 | Flanders | 181/148 X |
| 4,773,502 | 9/1988 | Adair | 181/149 |
| 4,787,472 | 11/1988 | Minnerath et al. | 181/199 X |
| 4,836,326 | 6/1989 | Wehner | 181/144 |
| 4,991,688 | 2/1991 | Kery et al. | 181/153 |

*Primary Examiner*—L. T. Hix
*Assistant Examiner*—Khanh Dang
*Attorney, Agent, or Firm*—MacMillan, Sobanski & Todd

[57] ABSTRACT

A loudspeaker enclosure is formed generally in the shape of a tetrahedron, having a triangular bottom panel and three upstanding triangular side panels. In a first embodiment, the lower edges of the three side panels are connected to the three edges of the bottom panel, and the upstanding edges of the side panels are connected together. One or more speakers are mounted in respective apertures formed through the front side panel of the enclosure such that the sound waves generated thereby are directed forwardly therefrom. Another speaker is supported within the enclosure facing generally downwardly, but is angled toward the front side panel of the enclosure. The sound waves generated by the downwardly facing speaker are emitted through an opening formed through the lower end of the front side panel. In a second embodiment, the side panels of the enclosure are connected together as above, but are supported above the bottom panel of the enclosure by a plurality of legs so as to define an open space extending about the bottom panel. The downwardly facing speaker faces directly downwardly toward the bottom panel, and the sound waves generated thereby are emitted through the open space around the enclosure.

7 Claims, 2 Drawing Sheets

LOUDSPEAKER ENCLOSURE

BACKGROUND OF THE INVENTION

The present invention relates in general to audio loudspeakers and in particular to an improved structure for an enclosure for such a loudspeaker.

Loudspeakers are well known devices which are designed to convert electrical energy signals into corresponding acoustical energy sound waves. Such loudspeakers typically include a closed box-shaped housing or similar enclosure having one or more individual speakers mounted on a side panel thereof. The speakers face outwardly from the enclosure such that the sound waves are emitted forwardly therefrom. When more than one speaker is provided on the enclosure, an electronic cross over circuit is usually provided to divide the electrical signals therebetween. The nature of the sounds generated by the loudspeaker is dependent upon many factors, including the size and shape of the enclosure, the size and number of speakers mounted within the enclosure, and the electronic cross over circuit.

One phenomenon which may degrade the quality of the sounds generated by the loudspeaker is known as back wave generation and reflection. Such back wave generation is caused by the speakers mounted in the side panel of the enclosure. Ideally, all of the sound waves generated by such speakers are emitted forwardly from the enclosure. However, in practice, it has been found that a small portion of the sound waves generated by the speakers are radiated inwardly within the loudspeaker enclosure. These inwardly directed sound waves are referred to as back waves. The back waves are believed to reflect off of the inner surfaces of the side panels of the enclosure, causing undesirable spurious noises. Consequently, it would be desirable to provide a loudspeaker enclosure which minimizes the effect of these back waves. Furthermore, it would be desirable to provide such a loudspeaker enclosure which accomplishes this, yet which is also aesthetically appealing.

SUMMARY OF THE INVENTION

This invention relates to an improved structure for a loudspeaker enclosure. The enclosure is formed generally in the shape of a tetrahedron, having a triangular bottom panel and three upstanding triangular side panels. In a first embodiment, the lower edges of the three side panels are connected to the three edges of the bottom panel, and the upstanding edges of the side panels are connected together. Preferably, the bottom panel is formed in the shape of an equilateral triangle. Each of the side panels are preferably formed in the shape of an isosceles triangle, wherein the lengths of the two upstanding edges are equal and longer than the length of the third lower edge. One or more speakers are mounted in respective apertures formed through the front side panel of the enclosure such that the sound waves generated thereby are directed forwardly therefrom. Another speaker is supported within the enclosure facing generally downwardly, but is angled toward the front side panel of the enclosure. The sound waves generated by the downwardly facing speaker are emitted through an opening formed through the lower end of the front side panel. In a second embodiment, the side panels of the enclosure are connected together as above, but are supported above the bottom panel of the enclosure by a plurality of legs so as to define an open space extending about the bottom panel. The downwardly facing speaker faces directly downwardly toward the bottom panel, and the sound waves generated thereby are emitted through the open space around the enclosure.

It is an object of this invention to provide an improved structure for a loudspeaker enclosure which minimizes the undesirable effects of back wave generation and reflection therein.

It is another object of this invention to provide such an improved structure for a loudspeaker enclosure having a shape which is aesthetically appealing.

It is a further object of this invention to provide such an improved structure for a loudspeaker which is simple and inexpensive in construction.

Other objects and advantages of this invention will become apparent to those skilled in the art from the following detailed description of the preferred embodiments, when read in light of the accompanying drawings.

DETAILED DESCRIPTION OF THE PREFERRED EMBODIMENT

Figure 1:
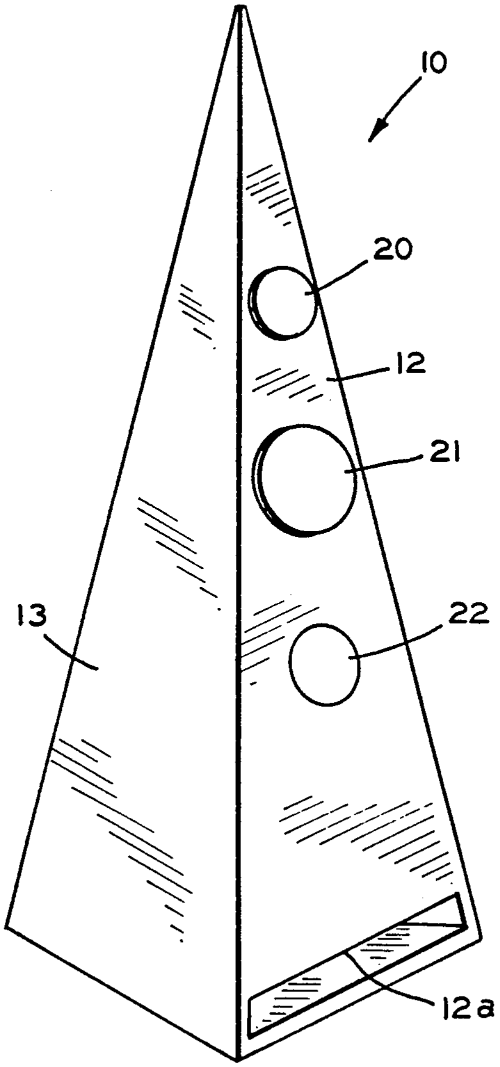
FIG. 1 is a perspective view of a first embodiment of a loudspeaker enclosure in accordance with this invention.
Figure 2:
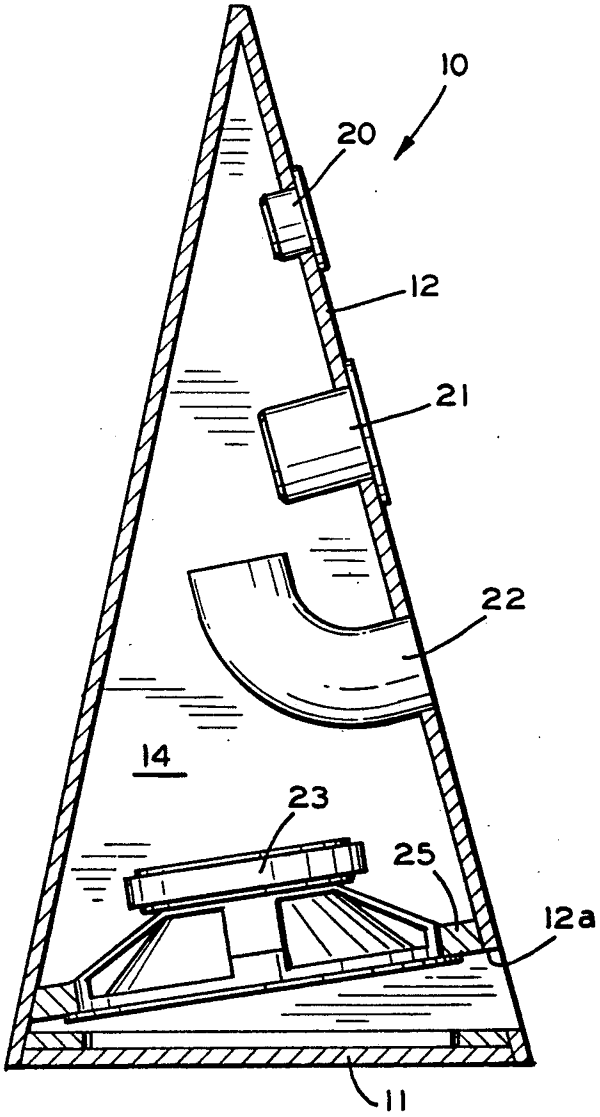
FIG. 2 is a sectional elevational view from the side of the loudspeaker enclosure illustrated in FIG. 1.

Referring now to the drawings, there is illustrated in FIGS. 1 and 2, a first embodiment of a loudspeaker, indicated generally at 10, in accordance with this invention. The first embodiment shows a uni-directional version of the loudspeaker 10. The loudspeaker 10 includes an enclosure which is formed generally in the shape of a tetrahedron. The enclosure includes a triangular bottom panel 11 and three upstanding triangular side panels 12, 13, and 14. The lower edges of the side panels 12, 13, and 14 are connected to the three edges of the bottom panel 11. Similarly, the upstanding edges of the side panels 12, 13, and 14 are connected together. When connected together in this manner, the bottom panel 11 and the side panels 12, 13, and 14 define an enclosure for the loudspeaker 10 which, as shown, is generally formed in the shape of a tetrahedron.

Preferably, the bottom panel 11 is formed in the shape of an equilateral triangle, wherein the lengths of each of the edges thereof are equal. Furthermore, the side panels 12, 13, and 14 are each preferably formed in the shape of an isosceles triangle, wherein the lengths of the two upstanding edges are equal and longer than the length of the third lower edge. As shown in the drawings, the lengths of the lower edges of the side panels 12, 13, and 14 are equal to the lengths of the edges of the bottom panel 11. The lengths of the upstanding edges of the side panels 12, 13, and 14 are preferably formed to be approximately twice the lengths of the lower edges thereof. The bottom panel 11 and the side panels 12, 13, and 14 can be constructed from any suitable material known for use in loudspeakers, such as wood, metal, or plastic, or a combination thereof.

As best shown in FIG. 2, first and second speakers 20 and 21 are mounted in respective apertures formed in the front side panel 12 of the loudspeaker 10. Thus, the sound waves generated thereby are directed forwardly from the side panel 12. The speakers 20 and 21 are conventional in the art and may, for example, be respectively adapted to produce high and mid-range frequency sound waves in response to excitation from appropriate source electrical energy signals. A conventional electrical cross over circuit (not shown) may be provided within the loudspeaker 10 to divide the source electrical signals between the speakers 20 and 21. Also, a conventional hollow horn 22 may be mounted in an aperture formed through the side panel 12.

A third speaker 23 is mounted within the enclosure for the loudspeaker 10. The third speaker 23 is also conventional in the art and may, for example, be adapted to produce low frequency sound waves in response to excitation from appropriate source electrical energy signals. As shown in FIG. 2, the third speaker 23 is supported on a mounting plate 25 disposed within the enclosure. The mounting plate 25 is secured by any conventional means to the inner surfaces of one or more of the side panels 12, 13, and 14. The mounting plate 25 is preferably oriented at approximately an angle relative to the bottom panel 11 so to as to face slightly toward the front side panel 12. This angle is preferably about twenty-eight degree relative to the bottom panel 11. Thus, the front edge of the mounting plate 25 (located adjacent to the inner surface of the front side panel 12) is disposed above the lower edge of the front side panel 12 and extends parallel thereto. A generally rectangular opening **12*a* is formed through the lower end of the front side panel 12. Thus, the sound waves generated from the third speaker 23, which are directed generally downwardly toward the bottom panel 11 and angled toward the lower end of the front side 12, are emitted through the opening 12*a***.

The tetrahedron shape of the enclosure has been found to minimize the undesirable effects of wave generation and reflection caused by the speakers 20, 21, and 23. This is because the rear ends of the speakers 21, 22, and 23 all face into corners defined within the enclosures. In other words, the rear ends of the two speakers 20 and 21 mounted on the front side panel 12 face rearwardly toward the corner defined between the other two side panels 13 and 14. It is believed that by directing the back waves primarily into these corners, they tend to cancel one another out, thus, reducing the overall adverse effects thereof. Also, since this corner slopes somewhat downwardly toward the bottom panel 11 of the enclosure the effects of the back waves generated by the speakers 20 and 21 are further minimized.

Similarly, the rear end of the speaker 23 faces toward the upper point of the enclosure defined by the ]unction of the upper ends of the three side panels 12, 13, and 14. As a result, there is little resonation of such back waves caused by reflections within the enclosure. This back wave cancellation is particularly important for the speaker 23, because the lower frequency sounds generated thereby tend to reflect more within the enclosure and, therefore, adversely affect the performance of the loudspeaker 10.

Figure 3:
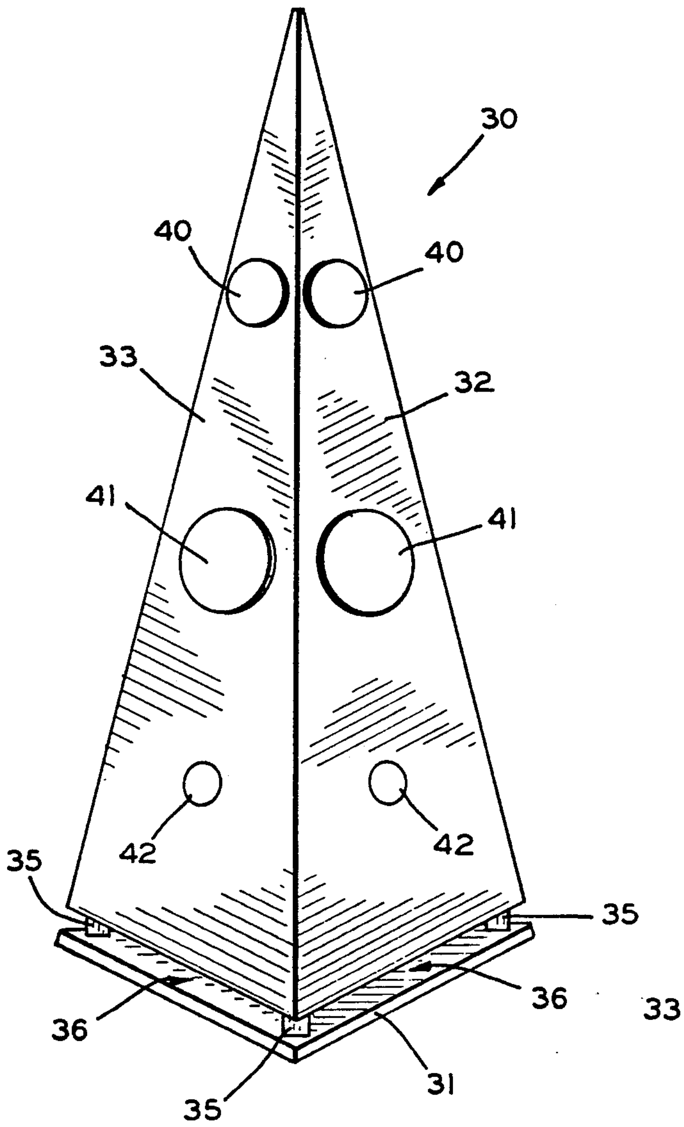
FIG. 3 is a perspective view of a second embodiment of a loudspeaker enclosure in accordance with this invention.
Figure 4:
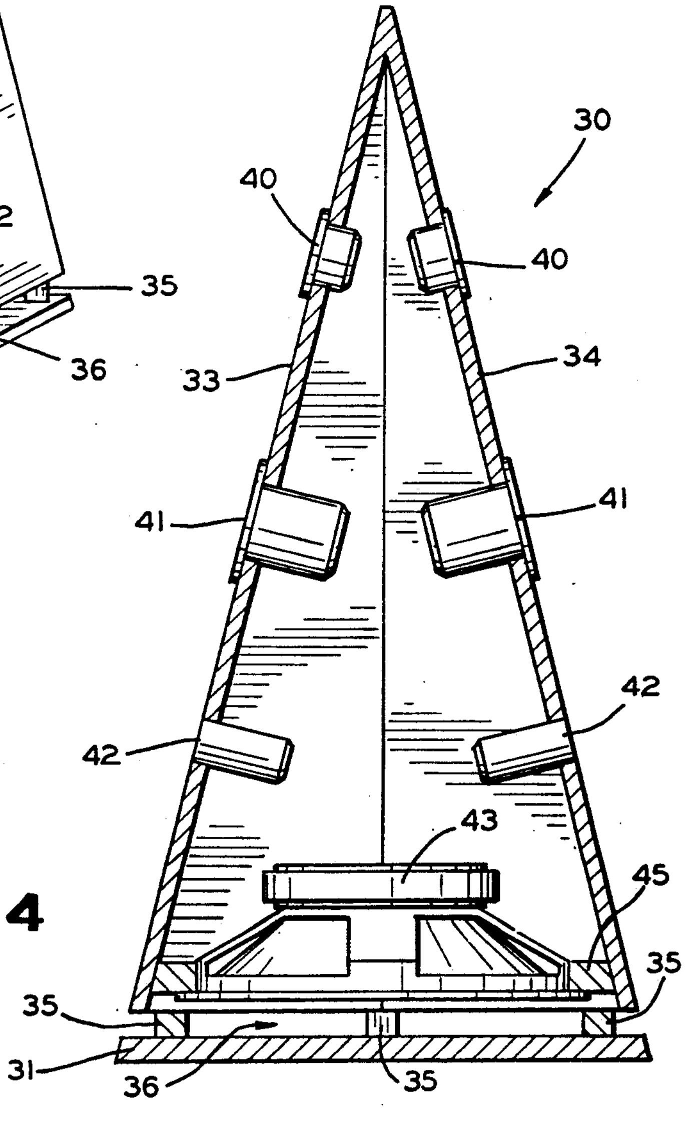
FIG. 4 is a sectional elevational view from the front of the loudspeaker enclosure illustrated in FIG. 3.

Referring now to FIGS. 3 and 4, there is illustrated a second embodiment of a loudspeaker, indicated generally at 30, in accordance with this invention. The second embodiment shows an omni-directional version of the loudspeaker 30. The loudspeaker 30 includes an enclosure formed by a triangular bottom panel 31 and three upstanding triangular side panels 32, 33, and 34. The two upstanding edges of the side panels 32, 33, and 34 are connected together, similar to the first embodiment illustrated in FIGS. 1 and 2. However, the lower edges of the side panels 32, 33, and 34 are not connected to the three edges of the bottom panel 31. Rather, the three side panels 32, 33, and 34 are connected to the bottom panel 31 by a plurality of legs 35. The legs 35 are connected between the upper surface of the bottom panel 31 and the lower edges of the side panels 32, 33, and 34 such that the side panels 32, 33, and 34 are supported above the bottom panel 31. Consequently, an open space, indicated generally at 36, is provided between the lower edges of the side panels 32, 33, and 34 and the bottom panel 31 throughout the entire enclosure. When connected together in this manner, the bottom panel 31 and the side panels 32, 33, and 34 define an enclosure for the loudspeaker 30 which is also generally formed in the shape of a tetrahedron.

As with the first embodiment, the bottom panel 31 is preferably formed in the shape of an equilateral triangle, wherein the lengths of each of the edges thereof are equal. Furthermore, the side panels 32, 33, and 34 are also each preferably formed in the shape of an isosceles triangle, wherein the lengths of the two upstanding edges are equal and longer than the length of the third lower edge. As shown in the drawings, the lengths of the lower edges of the side panels 32, 33, and 34 are approximately equal to the lengths of the edges of the bottom panel 31. The lengths of the upstanding edges of the side panels 32, 33, and 34 are also preferably formed to be approximately twice the lengths of the lower edges thereof. The bottom panel 31 and the side panels 32, 33, and 34 can be constructed from the same materials described above.

As best shown in FIG. 4, first and second speakers 40 and 41 are mounted in respective apertures formed through each of the side panels 32, 33, and 34 of the loudspeaker 30 such that the sound waves generated thereby are directed outwardly therefrom in three different directions. The speakers 40 and 41 are conventional in the art and may, for example, be respectively adapted to produce high and mid-range frequency sound waves in response to excitation from appropriate source electrical energy signals. A conventional electrical cross over circuit (not shown) may be provided within the loudspeaker 30 to divide the electrical signals between the speakers 40 and 41. Also, a conventional hollow horn 42 may be mounted in an aperture formed through each of the side panels 32, 33, and 34.

A third speaker 43 is mounted within the enclosure for the loudspeaker 30. The third speaker 43 is also conventional in the art and may, for example, be adapted to produce low frequency sound waves in response to excitation from appropriate electrical energy signals As shown in FIG. 4, the third speaker 43 is supported on a mounting plate 45 disposed within the enclosure. The mounting plate 45 is secured by any conventional means to the inner surfaces of one or more of the side panels 32, 33, and 34. The mounting plate 45 is preferably oriented so as to be parallel with the bottom 31. Thus, the sound waves generated from the third speaker 43 are directed downwardly toward the bottom panel 31 and are emitted through the open space 36 provided between the lower edges of the side panels 32, 33, and 34 and the bottom 31. The loudspeaker 30 functions in the manner described above to minimize the effects of back wave generation therein.

In accordance with the provisions of the patent statutes, the principal and mode of operation of the invention have been described and illustrated in its preferred embodiment. However, it must be understood that the invention may be practiced otherwise than as specifically explained and illustrated without departing from its scope or spirit.

What is claimed is:

1. A loudspeaker enclosure comprising:

a bottom panel having three edges;

three sides panels, each of said side panels being formed generally in the shape of an isosceles triangle including a lower edge and a pair of upstanding edges, each of said upstanding edges being substantially longer in length than said lower edges, each of said lower edges being connected to one of said edges of said bottom panel, said side panels being oriented such that said upstanding edges of adjacent side panels are disposed adjacent to one another, adjacent ones of said upstanding edges being secured together to form an enclosure which is generally shaped as a tetrahedron; and means for mounting a speaker in one of said side panels.

2. The invention defined in claim 1 wherein one of said side panels has an opening formed therethrough adjacent said lower edge.

3. The invention defined in claim 2 further including means for mounting a speaker within aid enclosure so as to face generally downwardly toward said bottom panel.

4. The invention defined in claim 3 wherein said means for mounting a speaker within aid enclosure is angled within the enclosure so as to face partially toward said opening in said side panel.

5. A loudspeaker enclosure comprising:

a bottom panel having three edges;

three side panels, each of said side panels being formed generally in the shape of an isosceles triangle including a lower edge and a pair of upstanding edges, each of said upstanding edges being substantially longer in length than said lower edges, said side panels being oriented such that said upstanding edges of adjacent side panels are disposed adjacent to one another, adjacent ones of said upstanding edges being secured together;

means for supporting each of said lower edges above and adjacent to one of said edges of said bottom panel to form an enclosure which is generally shaped as a tetrahedron; and means for mounting a speaker in one of said side panels.

6. The invention defined in claim 5 wherein said means for supporting includes a plurality of legs connected between an upper surface of said bottom panel and said lower edges of said side panels such that said side panels are supported above said bottom panel.

7. The invention defined in claim 6 further including means for mounting a speaker within said enclosure so as to face generally downwardly toward said bottom panel.

* * * * *

UNITED STATES PATENT AND TRADEMARK OFFICE
CERTIFICATE OF CORRECTION

PATENT NO. : 5,123,500

DATED : June 23, 1992

INVENTOR(S) : Thomas A. Malhoit and Virgil J. Wurster

It is certified that error appears in the above-identified patent and that said Letters Patent are hereby corrected as shown below:

Column 5
Claim 1, line 3, after "three", change "sides" to -- side --.

Claim 3, line 2, after "within", change "aid" to -- said --.

Column 6,
Claim 4, line 2, After "within", change "aid" to -- said --.

Signed and Sealed this

Third Day of August, 1993

Attest:

Michael K. Kirk

MICHAEL K. KIRK

*Attesting Officer* *Acting Commissioner of Patents and Trademarks*